(12) United States Patent
Andreev et al.

(10) Patent No.: US 7,934,139 B2
(45) Date of Patent: Apr. 26, 2011

(54) PARALLEL LDPC DECODER

(75) Inventors: Alexander Andreev, San Jose, CA (US);
Igor Vikhliantsev, San Jose, CA (US);
Sergey Gribok, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 1180 days.

(21) Appl. No.: 11/565,670

(22) Filed: Dec. 1, 2006

(65) Prior Publication Data
US 2008/0134008 A1 Jun. 5, 2008

(51) Int. Cl.
*H03M 13/00* (2006.01)
(52) U.S. Cl. .................................................. 714/752
(58) Field of Classification Search .................. 714/752
See application file for complete search history.

(56) References Cited

U.S. PATENT DOCUMENTS

| 7,000,177 | B1 * | 2/2006 | Wu et al. | 714/801 |
| 2004/0240590 | A1 * | 12/2004 | Cameron et al. | 375/340 |
| 2008/0282127 | A1 * | 11/2008 | Mantha et al. | 714/751 |

OTHER PUBLICATIONS

Shimizu, K, A parallel LSI schitecture for LDPC decoder improving message-passing schedule, Sep. 2006, IEEE, pp. 5100-51-1.*

* cited by examiner

*Primary Examiner* — Scott T Baderman
*Assistant Examiner* — Enam Ahmed
(74) *Attorney, Agent, or Firm* — Luedeka, Neely & Graham, P.C.

(57) ABSTRACT

An LDPC decoder that implements an iterative message-passing algorithm, where the improvement includes a pipeline architecture such that the decoder accumulates results for row operations during column operations, such that additional time and memory are not required to store results from the row operations beyond that required for the column operations.

2 Claims, 2 Drawing Sheets $$H =$$

$$\begin{pmatrix}
00100000 & 00000001 & 00001000 & 00000100 & 01000000 & 10000000 & 00000010 \\
00010000 & 10000000 & 00000100 & 00000010 & 00100000 & 01000000 & 00000001 \\
00001000 & 01000000 & 00000010 & 00000001 & 00010000 & 00100000 & 10000000 \\
00000100 & 00100000 & 00000001 & 10000000 & 00001000 & 00010000 & 01000000 \\
00000010 & 00010000 & 10000000 & 01000000 & 00000100 & 00001000 & 00100000 \\
00000001 & 00001000 & 01000000 & 00100000 & 00000010 & 00000100 & 00010000 \\
10000000 & 00000100 & 00100000 & 00010000 & 00000001 & 00000010 & 00001000 \\
01000000 & 00000010 & 00010000 & 00001000 & 10000000 & 00000001 & 00000100 \\
\\
10000000 & 00100000 & 01000000 & 00000100 & 00010000 & 00001000 & 00000001 \\
01000000 & 00010000 & 00100000 & 00000010 & 00001000 & 00000100 & 10000000 \\
00100000 & 00001000 & 00010000 & 00000001 & 00000100 & 00000010 & 01000000 \\
00010000 & 00000100 & 00001000 & 10000000 & 00000010 & 00000001 & 00100000 \\
00001000 & 00000010 & 00000100 & 01000000 & 00000001 & 10000000 & 00010000 \\
00000100 & 00000001 & 00000010 & 00100000 & 10000000 & 01000000 & 00001000 \\
00000010 & 10000000 & 00000001 & 00010000 & 01000000 & 00100000 & 00000100 \\
00000001 & 01000000 & 10000000 & 00001000 & 00100000 & 00010000 & 00000010 \\
\\
10000000 & 10000000 & 10000000 & 10000000 & 10000000 & 10000000 & 10000000 \\
01000000 & 01000000 & 01000000 & 01000000 & 01000000 & 01000000 & 01000000 \\
00100000 & 00100000 & 00100000 & 00100000 & 00100000 & 00100000 & 00100000 \\
00010000 & 00010000 & 00010000 & 00010000 & 00010000 & 00010000 & 00010000 \\
00001000 & 00001000 & 00001000 & 00001000 & 00001000 & 00001000 & 00001000 \\
00000100 & 00000100 & 00000100 & 00000100 & 00000100 & 00000100 & 00000100 \\
00000010 & 00000010 & 00000010 & 00000010 & 00000010 & 00000010 & 00000010 \\
00000001 & 00000001 & 00000001 & 00000001 & 00000001 & 00000001 & 00000001
\end{pmatrix}$$

Fig. 2

PARALLEL LDPC DECODER

FIELD

This invention relates to the field of integrated circuit fabrication. More particularly, this invention relates to an efficient, parallel low-density parity-check (LDPC) decoder for a special class of parity check matrices that reduces the amount of memory and time that are required for the necessary calculations.

BACKGROUND

LDPC code is typically a linear stream of data in a self-correcting format that can be represented by an (m,n)-matrix with a relatively small, fixed number of ones (nonzero for arbitrary GF(q)) in each row and column, where m is the number of check bits and n is the code length in bits.

The most famous algorithm for decoding LDPC codes is called the iterative message-passing algorithm. Each iteration of this algorithm consists of two stages. In stage 1 (the row operations), the algorithm computes messages for all of the check nodes (the rows). In stage 2 (the column operations), the algorithm computes messages for all of the bit nodes (the columns), and sends them back to the check nodes associated with the given bit nodes. There are many different implementations of this message-passing algorithm, but all of them use two-stage operations. Further, in each of these implementations, the second step starts only after all of the messages for all of the rows have been calculated.

As with all information processing operations, it is desirable for the procedure to operate as quickly as possible, while consuming as few resources as possible. Unfortunately, LDPC codes such as those described above typically require a relatively significant overhead in terms of the time and the memory required for them to operate.

What is needed is an LDPC code that operates in a more efficient manner, such as by reducing the amount of time or the amount of memory that is required by the operation.

SUMMARY

The above and other needs are met by an LDPC encoder that implements an iterative message-passing algorithm, where the improvement includes a pipeline architecture such that the decoder accumulates results for row operations during column operations, such that additional time and memory are not required to store results from the row operations beyond that required for the column operations.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 2 is an example of an LDPC encoding matrix according to an embodiment of the present invention.

DETAILED DESCRIPTION

Figure 1:
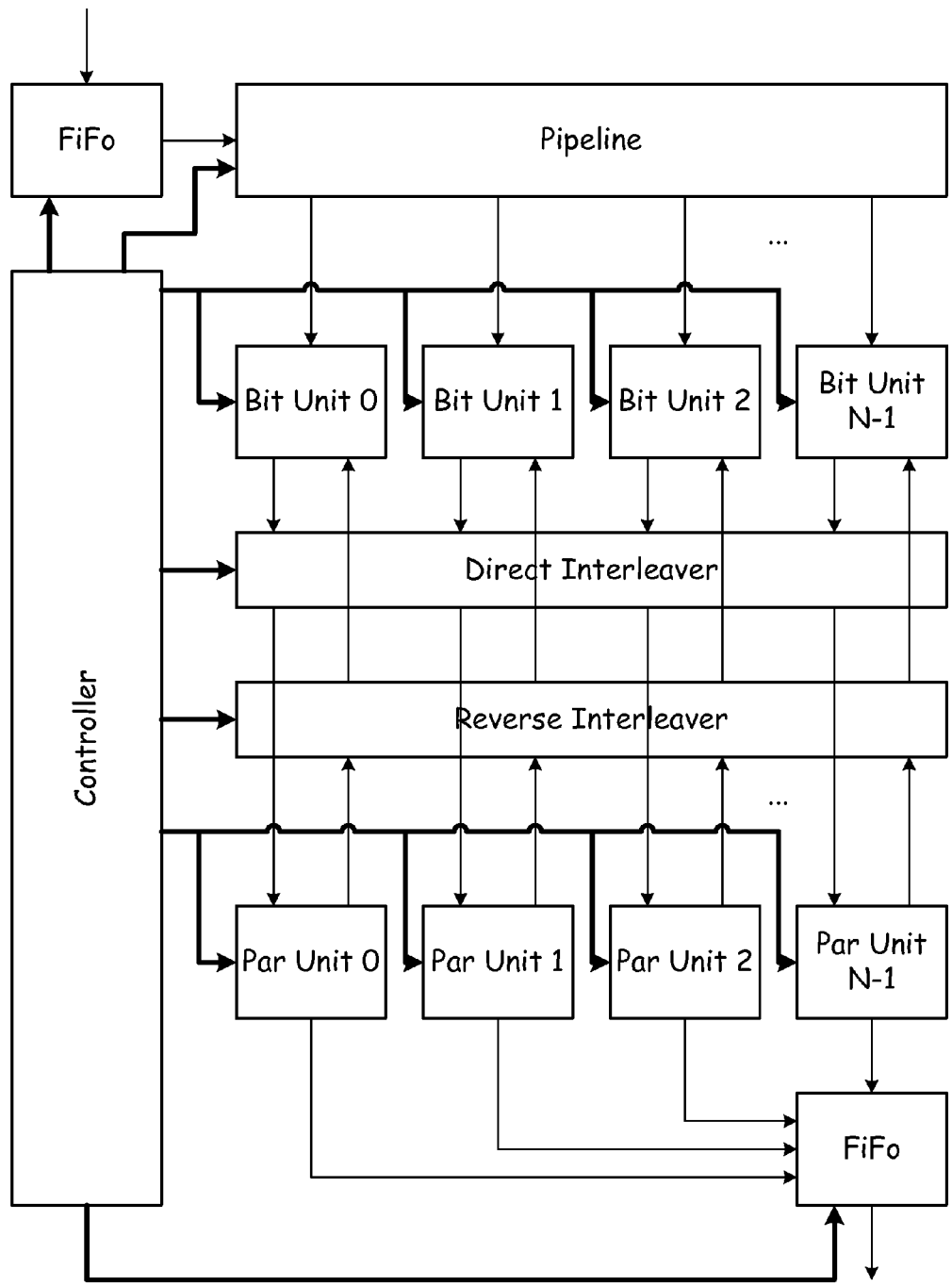
FIG. 1 is a functional block diagram of an LDPC decoder according to an embodiment of the present invention.

The LDPC algorithm described herein accumulates results for the row operations during the column operations, so that additional time and memory are not required to store the results from the row operations while the column operations are conducted. One embodiment of the method according to the present invention is presented below for the purpose of example. The method is described in reference to a hardware embodiment of the invention, as given in FIG. 1.

Initialization Step

For each parity bit w and code bit v, calculate:

$$md\_m[v]=Pv(0)/Pv(1),$$

$$md\_g[v][w]=md\_m[v], \text{ and}$$

$$md\_R[w]=md\_m[v]),$$

where Pv(0) and Pv(1) are the possibilities (from the Viterbi decoder) that bit v is equal to either 0 or 1, respectively. O(v) denotes the set of all parity bits w that include code bit v.

First Step of Iteration Process

Compute the following:

$$S[v] = \left(\prod_{w \in O(v)} \frac{md\_R[w]}{md\_g[v][w]}\right) \cdot md\_m[v] \quad (1)$$

$$loc\_item[v][w] = \frac{md\_R[w]}{md\_g[v][w]} \quad (2)$$

$$md\_g\_new[v][w] = \frac{S[v]}{loc\_item[v][w]} \quad (3)$$

$$md\_R\_new[w] = f^{-1}\left(\prod_{v \in O(w)} f(md\_g\_new[v][w])\right), \quad (4)$$

where $$f(x) = \frac{1+x}{1-x}$$

(the Gallager function), O(w) is all of the code bits from the parity bit w, and O(v) is all of the parity bits w that include the code bit v.

Calculations (1) and (2) above are performed for v=i, and calculations (3) and (4) are performed for v=i−1. Then, calculations (1) and (2) are performed for v=i+1, and calculations (3) and (4) are performed for v=i, and so on, through a pipeline architecture in the arithmetic unit, depicted in FIG. 1. When all of the code bits v have been processed, the values are assigned as given below, $$md\_g[v][w]=md\_g\_new[v][w] \quad (6)$$

$$md\_R[w]=md\_R\_new[w] \quad (7)$$

for each message bit v and parity bit w. A single iteration as described above is performed. The so-called "hard decision" for each code bit v is performed during this single iteration, where:

$$hard\_decision[v] = 0 \text{ if } sign\left(\prod_{w \in O(v)} loc\_item[v][w]\right) = 1 \quad (8)$$

and $$hard\_decision[v] = 1 \text{ if } sign\left(\prod_{w \in O(v)} loc\_item[v][w]\right) = -1 \quad (9)$$

Products for the formulas (8) and (9) were already calculated during calculation (1) for S[v]. Preferably, the calculations are performed in the logarithmic domain, so all products are replaced by sums as implemented in the arithmetic unit.

Parallel Architecture

One embodiment of the LDPC decoder as described herein includes a controller, an input fifo (first-in, first-out buffer, from the Viterbi decoder), an output fifo (first-in, first-out buffer for the final hard decision, or to another process, such as a Reed-Solomon computation), a pipeline, two interleavers, and t functional units of two types: Bit units and Par units, all as depicted in FIG. 1. The Bit units calculate data on bit nodes, and the Par units calculate data on check nodes.

Each Par unit preferably contains pipelined memories for storing values of md_R[w] and md_R_new[w]. Each Bit unit preferably contains pipelined memories for storing values of S[v], md_m[v], and loc_item. Each unit is preferably pipelined, meaning that it can store data for a few different nodes at the same time. In the embodiment depicted the arithmetic unit is separated for simplification and to show all the more relevant connections. However, the present invention is applicable to a wide variety of arithmetic unit architectures that are capable of performing calculations (1) through (9) above. Also, in the embodiment as depicted in FIG. 1, memories are embedded into the arithmetic unit, but in other embodiments they could be separate from the arithmetic unit.

A special parity check is used for (m,n) matrices H for LDPC-codes, which parity check can be represented by a matrix (M,N) from permutation (r,r) cell $H_{i,j}$, where m=M·r, n=N·r, and r(modt)=0. An example of the matrix H is given in FIG. 2, where M=3, N=7, r=8, m=24, and n=56. The permutation matrix contains exactly one value of one in each sub row and sub column. To reduce the number of operations per circuit gate, circulant permutation matrices are used in one embodiment, which matrices are determined by formula:

$$p(j)=p(0)+j(\mathrm{mod}\ r)$$

where p(i) is the index of the column with a value of one in $i^{th}$ row. For example, p(0)=2 for the upper left cell in FIG. 2 (where counting of both rows and columns starts with zero). Thus, we can use the initial index p(0) of one in the first row to determine each circulant permutation matrix. Similarly, the function c(j) returns the index of row with a value of one in the $j^{th}$ column.

Groups of t columns from the matrix H are logically divided into stripes. Assume that we already have a value of md_g[v][w] for each pair (v,w), where $w \in O(v)$, and a value of mg_R[w] for each parity bit w. Starting from the first stripe, the following operations are performed in one embodiment. Calculate the addresses for the t memories that contain md_R for all of the check nodes, according to the following formula:

$$\mathrm{address}(w) = \mathrm{cell\_index}(H_{ij})(\mathrm{mod}M) \cdot (r/t) + c(v)/t \quad (10)$$

where c(v) is the row index of the value one in the column for v from $H_{i,j}$ and cell_index($H_{i,j}$)=i+j·M.

The value of md_R[w] for the t memories is input on the reverse interleaver that computes the permutation, according to the function:

$$\pi(i)=c(i)(\mathrm{mod}\ t)\ \text{for given}\ H_{i,j}. \quad (11)$$

Then, all of the values of md_R[w] are input to the rightmost Bit unit to produce the sum S[v]. The method then continues with the same stripe in $H_{i+1,j}$, $H_{i+2,j}$, and so on.

For the second and subsequent stripes, we calculate the value loc_item and accumulate the sum S[v] for the current bits as described above, and retain the previously computed values of S[v] and loc_item for the bits from the previous stripe in the pipeline in the Bit unit. Then the values of S[v] and loc_item are retrieved from the pipeline and rearranged through the direct interleaver, which computes the permutation τ according to the function:

$$\tau(\pi(i))=i,\ \text{where}\ \pi,\ \tau \in H_{i,j}. \quad (12)$$

and then calculates the values md_g_new and md_R_new according to formulas (3) and (4) for both v and w from the pipeline. When all the stripes have been processed in this manner, the values of md_g_new and md_R_new are used to replace the values of md_g and md_R as given in equations (6) and (7), and one cycle of the iteration is completed.

Block-Schema of Algorithm

1. Starting with a $k^{th}$ stripe and a cell $H_{i,j}$ with index s.
2. Calculate AR_BIT[i].md_m=md_m[v[$k_{t+i}$]] where i= 0, ..., t−1.
3. Calculate the addresses for $w^s \in O(v)$ for v from cell $H_{i,j}$ with index s according to formula (11).
4. Calculate AR_BIT[i].md_R=AR_PAR[$\pi^s(i)$].md_R[$w^s$], where $\pi^s$ is the reverse permutation for the cell with index s.
5. Calculate AR_BIT[i].md_g=md_g[v[$k_{t+i}$]][$w^s$].
6. Calculate AR_BIT[i].loc_item[v[$k_{t+i}$]][$w^s$] according to formula (2).
7. Calculate AR_BIT[i].S[v[$k_{t+i}$]] according to formula (1).
8. Calculate AR_PAR[i].loc_item[v[(k−1)$_{t+i}$]][$w^{s-M}$]=AR_BIT[$\tau^{s-M}$[i]].loc_item[v[(k−1)$_{t-i}$]][$w^{s-M}$] and AR_PAR[i].S[v[(k−1)$_{t+i}$]]=AR_BIT[$\tau^{s-M}$[i]].S[v[(k−1)$_{t+i}$]], where $\tau^{s-M}$ is the direct permutation for the cell with an index of s−M.
9. Calculate AR_BIT[i].md_g_new[v[(k−1)$_{t+i}$]][$w^{s-M}$] according to formula (3).
10. Calculate AR_BIT[i].md_R_new[$w^{s-M}$] according to formula (4).
11. Go to the next cell, with an index of s+1.
12. If s+1(mod M)=0, then go to the next stripe (k+1).
13. If all cells pass step 12 above, then assign the values as given in equations (6) and (7), and start a new iteration for the $0^{th}$ stripe and the $0^{th}$ cell.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An LDPC decoder for decoding a data matrix having information in bit nodes of rows of the data matrix and check nodes in columns of the data matrix, the LDPC decoder comprising:
   an input buffer configured to receive the data stream from a Viterbi decoder,
   a pipeline configured to receive the data stream from the input buffer and provide the data stream in a lockstep pipeline to a plurality of bit units, the plurality of bit units configured to calculate data on bit nodes and provide the data stream to a direct interleaver, the direct interleaver configured to provide data to a plurality of par units, the plurality of par units configured to calculate data on check nodes, and provide data to a reverse interleaver, the reverse interleaver configured to provide data back to the plurality of bit units, the plurality of par units further configured to provide encoded data to an output buffer, the output buffer configured to receive the encoded data from the par units, and a controller configured to coordinate data flow within the LDPC decoder.

2. A processor-based method of decoding data for an LDPC matrix H, the method comprising:

a. starting with a $k^{th}$ stripe and a cell $H_{i,j}$ with index s, b. calculate with the processor AR_BIT[i].md_m=md_m[v[$k_{t+i}$]] where i=0, ..., t−1, c. calculate with the processor addresses for $w^s \in O(v)$ for v from cell $H_{i,j}$ with index s according to $\pi(i)=c(i)(\mod t)$ for given $H_{i,j}$, d. calculate with the processor AR_BIT[i].md_R=AR_PAR[$\pi^s(i)$].md_R[$w^s$], where $\pi^s$ is a reverse permutation for cell s, e. calculate with the processor AR_BIT[i].md_g=md_g[v[$k_{t+i}$]][$w^s$], f. calculate with the processor AR_BIT[i]loc_item[v[$k_{t+i}$]][$w^s$] according to:

$$\text{loc\_item}[v][w] = \frac{\text{md\_R}[w]}{\text{md\_g}[v][w]},$$

g. calculate with the processor AR_BIT[i].S[v[$k_{t+i}$]] according to:

$$S[v] = \left(\prod_{w \in O(v)} \frac{\text{md\_R}[w]}{\text{md\_g}[v][w]}\right) \cdot \text{md\_m}[v],$$

h. calculate with the processor AR_PAR[i]loc_item[v[(k−1)$_{t+i}$]][$w^{s-M}$]=AR_BIT[$\tau^{s-M}$[i]].loc_item[v[(k−1)$_{t+i}$]][$w^{s-M}$] and AR_PAR[i].S[v[(k−1)$_{t+i}$]]=AR_BIT[$\tau^{s-M}$[i]].S[v[(k−1)$_{t+i}$]], where $\tau^{s-M}$ is a direct permutation for cell s−M, i. calculate with the processor AR_BIT[i].md_g_new[v[(k−1)$_{t+i}$]][$w^{s-M}$] according to:

$$\text{md\_g\_new}[v][w] = \frac{S[v]}{\text{loc\_item}[v][w]},$$

j. calculate with the processor AR_BIT[i].md_R_new[$w^{s-M}$] according to:

$$\text{md\_R\_new}[w] = f^{-1}\left(\prod_{v \in O(w)} f(\text{md\_g\_new}[v][w])\right),$$

k. go to cell s+1, l. if s+1(mod M)=0, then go to stripe (k+1), and m. if all cells satisfy step (1), then assign md_g[v][w]=md_g_new[v][w] and md_R[w]=md_R_new[w], and start a new iteration at step (a) for the $0^{th}$ stripe and the $0^{th}$ cell, until the entire matrix H is processed, n. to produce a coded matrix of data.

* * * * *